United States Patent [19]

Roberts

[11] Patent Number: 4,938,106

[45] Date of Patent: Jul. 3, 1990

[54] HAND TOOL FOR INSTALLING AND EXTRACTING CIRCUIT BOARD TEST POINTS

[76] Inventor: Bruce Roberts, 1348 Homestead Way, Palm Harbor, Fla. 34683

[21] Appl. No.: 294,256

[22] Filed: Jan. 4, 1989

[51] Int. Cl.⁵ .............................................. B25B 13/06
[52] U.S. Cl. ........................................ 81/55; 81/124.5
[58] Field of Search ................ 81/13, 55, 124.4, 125, 81/124.5

[56] References Cited

U.S. PATENT DOCUMENTS 2,194,069  3/1940  Gagne ................................. 81/55 X
3,485,118 12/1969  Maughan, Jr. .................... 81/55 X
4,329,892  5/1982  Daigle .................................... 81/55

FOREIGN PATENT DOCUMENTS 876655  5/1953  Fed. Rep. of Germany .......... 81/55
120163  3/1958  U.S.S.R. .................................. 81/13

Primary Examiner—D. S. Meislin
Attorney, Agent, or Firm—Stanley M. Miller

[57] ABSTRACT

A hand held tool about the size of a conventional screwdriver that facilitates the installation and removal of circuit board test points. A first socket member at the distal end of the tool engages the outer part of a test point and a second socket member in axial alignment with the first engages the inner part of the test point. The first socket member has an inner diameter greater than the outer diameter of the second socket member so that the second socket member is retractable into the first when the outer and inner parts of a test point are simultaneously engaged by the first and second socket members, respectively. A spring maintains the second socket member forwardly of the first socket member when the tool is not in use. The socket members are independently rotatable under the control of separate handle members.

9 Claims, 1 Drawing Sheet

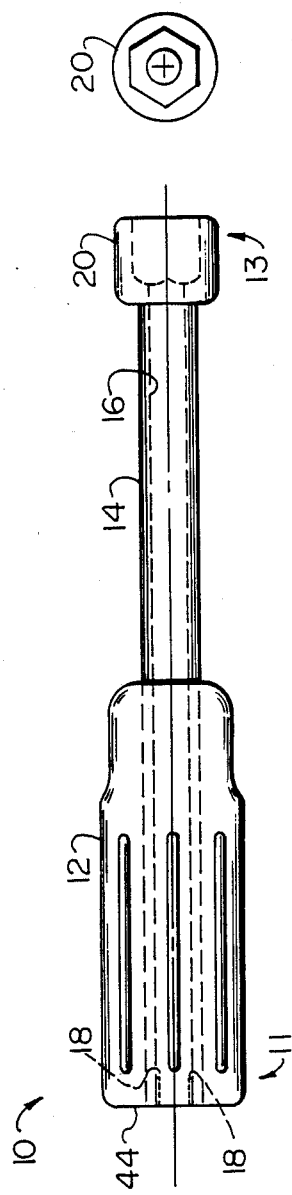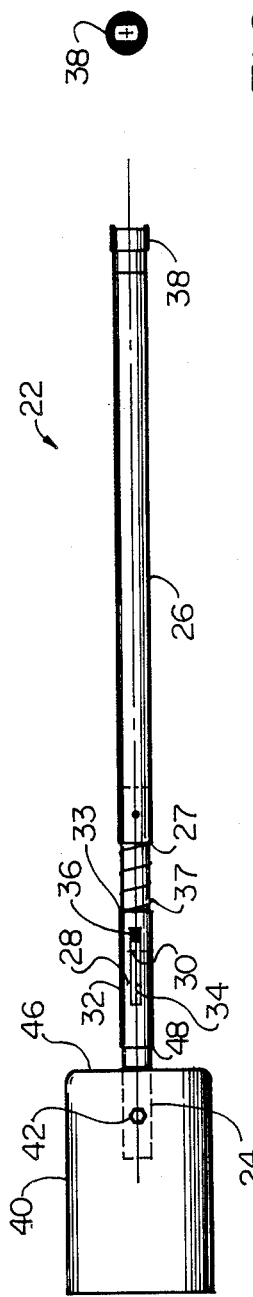

HAND TOOL FOR INSTALLING AND EXTRACTING CIRCUIT BOARD TEST POINTS

TECHNICAL FIELD

This invention relates to the field of hand tools, generally. More specifically, it relates to a hand tool having utility in connection with the installation and extraction of circuit board test points.

BACKGROUND ART

Circuit board test points, as their name implies, are mechanical structures positioned on circuit boards to which test instrument leads are touched when the circuit is being tested.

Test points, also known as banana jacks, are installed at preselected points in the circuit board prior to testing, and are sometimes removed from the circuit board when the testing is completed, unless they form a permanent part of the board.

Due to their configuration, it has heretofore been necessary for the test point installer to use two hands during the installation process; a first hand has been required to manipulate the test points on a first side of a circuit board and a second hand to manipulate the test points on a second, opposite side of the circuit board.

The same two-handed procedure has been required in accomplishing removal of test points.

If a tool could be developed that would enable test points to be installed and removed with one hand or at least with both hands on the same side of the circuit board, the art of hand tools in general would be advanced and the specific art of eletronic industry hand tools would be benefitted.

However, the prior art neither teaches nor suggests a tool or method whereby test point installation and removal could be accomplished with a single hand or with two hands on the same side of the board.

DISCLOSURE OF INVENTION

The present invention has the general appearance and is roughly the size of a conventional screw driver in that it includes a handle portion and an elongate shank portion.

However, it is not similar to a conventional screw driver in any other important respect.

The novel tool includes a first handle member that is fixedly secured to an elongate shank member that terminates at its distal free end in a socket means adapted to engage the outer portion of a test point.

The first handle member and the shank member are centrally bored along their longitudinal extent to slideably receive an inner shaft member having a length greater than the combined length of the first handle member and the shank member. Thus, the first handle member and shank member collectively form a housing member for the inner shaft member.

The distal free end of the inner shaft member is adapted to engage the central portion of a test point.

Since the housing member is elongate but shorter in length than the inner shaft member it houses, when the inner shaft member is slideably disposed in the housing member, the proximal end of the inner shaft member protrudes from the proximal end of the first handle member and the distal end of the inner shaft member extends distally of the distal end of the housing member.

A second handle member is secured to the protruding proximal portion of the inner shaft member. Thus, manipulation of the second handle member controls the inner shaft member and effects manipulation of the inner part of the test point whereas manipulation of the first handle member effects manipulation of the outer portion of the test point.

The inner shaft member is discontinuous near its proximal end and its proximal, truncate part is longitudinally spaced from its distal, elongate part, in axial alignment therewith. A cylindrical yoke member is fixedly secured to the proximal part and slideably receives the distal part. A bias means urges the yoke member in a distal to proximal direction so that the proximal part of the inner shaft member is spaced apart from its distal part when the tool is at equilibrium.

Thus, when the distal free end of the inner shaft member is placed into engagement with the central part of a test point, proximal-to-distal travel of the first and second handle members compresses the bias means so that the distal free end of the inner shaft xexber retracts into the larger diameter distal free end of the shank member until the shank member distal free end engages the outer part of the test point so that the inner and outer parts of the test point are simultaneously engaged.

Thus, removal or installation of a test point is accomplished by relative rotation between the first and second handle members when both parts of the test point are simultaneously engaged, i.e., when the bias means has been compressed by the proximal-to-distal travel of the tool.

It is therefore understood that a primary object of this invention is to provide a hand-held tool having utility in connection with the installation and removal of circuit board test points.

Another important object is to provide such a tool that is suitable for one hand operation or for two-handed operation on one side of a circuit board.

The invention accordingly comprises the features of construction, combination of elements and arrangement of parts that will be exemplified in the construction hereinafter set forth, and the scope of the invention will be indicated in the claims.

BRIEF DESCRIPTION OF THE DRAWINGS

For a fuller understanding of the nature and objects of the invention, reference should be made to the following detailed description, taken in connection with the accompanying drawings, in which:

FIG. 1 is a side elevational view of the first handle xexber and the shank member that collectively form the novel housing means;

FIG. 2 is an end view of the distal free end of the shank member, showing how it conforms in size and shape to the outer part of a test point for keyed engagement therewith;

FIG. 3 is a side elevational view of the inner shaft member of this invention;

FIG. 4 is an end view of the distal free end of the inner shaft member, showing how it conforms in size and shape to the central or inner part of a test point for keyed engagement therewith.

BEST MODES FOR CARRYING OUT THE INVENTION

Referring now to FIG. 1, it will there be seen that the first major part of the novel tool is denoted by the reference numeral 10 as a whole.

Part 10 includes a handle member 12 and a shank xexber 14 integral therewith.

The proximal end of part 10 is denoted 11 and its distal end is denoted 13, generally.

A central bore 16 is formed along the extent of both the handle and the shank members; an annular shoulder means 18 is formed near the proximal end 11 of the central bore 16 and its function will become clear as this description proceeds.

The distal end 13 of shank xexber 14 forms a socket means 20 that engages the hexagonally-shaped outer part of a conventional test point (not shown), as perhaps best understood in connection with FIG. 2.

Thus, rotation of handle member 12 effects simultaneous and corresponding rotation of the outer part of a test point.

FIG. 3 depicts the second major part of the novel tool; the second major part, or inner shaft member, is denoted 22 as a whole.

It should be understood from the outset that the inner shaft member 22 is discontinuous in that its truncate proximal part 24 is longitudinally spaced apart from its elongate distal part 26. The distal end of proximal part 24 is denoted 28 and the proximal end of the distal part 26 is denoted 30.

The two spaced apart members 24, 26 of the inner shaft member 22 are in axial alignment with one another as shown and are yoked together by a cylindrical yoke member 32 that is slotted as at 34 to slideably receive a guide post member 36 that prevents relative rotation of the proximal and distal parts 24, 26 of the inner shaft member 22. Guide post member 36 is integral to the distal portion 26 of the inner shaft xexber 22 and yoke xexber 32 is integral to the proximal part 24 thereof. The yoke member 32 slideably receives the proximal end 30 of the distal part 26 of inner shaft member 22.

A bias means 37 is compressively engaged between a shoulder means formed by the distal end 33 of yoke xexber 32 and by a reduced diameter portion of distal part 26 that is denoted 27.

A socket means 38 that engages the central or inner part of a test point is formed at the distal end of inner shaft member 22. Socket means 38 is specifically configured for keyed engagement to the central or inner part of a test point (not shown), as best understood in connection with FIG. 4.

When the novel device is assembled, inner shaft member 22 (FIG. 3) is slidably disposed within central bore 16 (FIG. 1). Inner shaft member 22 is longer than the combined length of first handle member 12, shank 14 and socket means 20. Thus, proximal part 24 of the inner shaft member 22 protrudes proximally of first handle member 12 and socket means 38 protrudes distally of socket means 20 when the device is at equilibrium, i.e., when bias means 37 is not compressed.

The annular shoulder means 18 formed at the proximal end of the central bore means 16 serves as a stop means that limits the insertion of inner shaft member 22 into said central bore means 16.

As is clear from a comparison of FIGS. 2 and 4, the outer diameter of socket means 38 is less than the inner diameter of socket means 20; when the tool is used as hereinafter described, socket means 38 retracts into means 20 and becomes coplanar therewith so that both socket means engage their associated parts of a test point at the same time.

Rotation of the inner shaft member 22 and hence of socket means 38 is accomplished through rotation of a second handle member 40 which is fixedly secured to the proximal part 24 of the inner shaft member 22. Reference numeral 42 denotes an Allen head connection means, although second handle member 40 may be secured to proximal part 24 by any suitable means.

When the device is fully assembled and in its equilibrium configuration, proximal wall 44 of first handle member 12 (FIG. 1) abuts distal wall 46 of the second handle member 40 (FIG. 3). Moreover, the proximal annular shoulder 48 of yoke member 32 (FIG. 3) abuts annular shoulder 18 adjacent the proximal end of first handle member 12 (FIG. 1).

Accordingly, rotation of second handle xexber 40 effects simultaneous and corresponding rotation of socket means 38, independently of any movement of housing member 10 which includes the first handle member 12, shank member 14 and socket means 20.

To remove a test point from a circuit board, socket means 38 of the inner shaft member 22 is placed into engagement with the central part of a test point. Handle members 12 and 40 are then displaced as a unit in a proximal-to-distal direction, i.e., against the bias means 37, until socket means 20 engages the outer part of the test circuit. The discontinuous parts 24 and 26 of the inner shaft member 22 will then be in closely spaced or abutting relation to one another although no relative rotation therebetween will have occured due to the sliding of guidepost member 36 within slot 34.

When the first and second handle members of the tool have been so advanced, socket means 20 engages the outer part of the test point and be means 38 engages the inner part thereof as aforesaid, and socket means 20 will house socket means 38 in enveloping relation thereto.

Relative rotation of the first and second handle members 12 and 40, respectively, thus results in removal of the test point.

Test point installation is accomplished in a similar manner.

INDUSTRIAL APPLICABILITY

Circuit board test point removal and installation occurs millions of times daily worldwide. Virtually all removals and installations have heretofore required the use of hands disposed on opposite sides of a board; thus it is clear that this invention will have a significant impact upon the efficiency of the worldwide electronics industry.

It will thus have seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described,

What is claimed is:

1. A hand-held tool having utility in connection with the installation and removal of test points, comprising:
   a first socket means adapted to engage a test point outer part;
   a second socket means adapted to engage a test point inner part;

a first handle member;

an elongate shank member disposed in interconnecting relation to said first handle member and said first socket means;

a second handle member;

an elongate inner shaft member disposed in interconnecting relation to said second handle member and said second socket means;

said inner shaft member having a length greater than the combined length of said first handle member, shank member and first socket means;

an elongate bore means formed in said first handle member, shank member and first socket means;

said inner shaft member being slideably disposed in said bore means;

said second socket means having an outer diameter less than the inner diameter of said first socket means;

said inner shaft member being formed of two longitudinally spaced parts disposed in axial alignment with one another;

bias means for urging said second socket means distally of said first socket means;

said bias means maintaining said two parts in spaced relation to one another when the bias means is in a state of equilibrium;

said two parts of said inner shaft member being a proximal part and a distal part;

a cylindrical yoke member being fixedly secured to said proximal part, said yoke member slideably receiving a proximal end of said distal part to maintain the two parts in axial alignment with one another;

whereby a test point is removed by engaging its inner part with said second socket means, compressing said bias means until said second socket means retracts into said first socket means and rotating said first and second handle members relative to one another;

2. The tool of claim 1, further comprising a longitudinally extending slot means formed in said yoke member and further comprising an upstanding guide post member fixedly secured to said proximal end of said distal part of said inner shaft member, said guide post member being slidably disposed within said slot means and being operative to maintain the two parts of said inner shaft member in rotational alignment with one another.

3. The tool of claim 2, wherein the proximal part of said inner shaft member protrudes distally of said first handle member and wherein said second handle member is fixedly mounted to the distally protruding part of said proximal part of said inner shaft member, whereby rotation of said second handle member effects simultaneous and corresponding rotation of said second socket means independently of any rotation of said first handle member and said first socket means.

4. The tool of claim 3, wherein a distal end of said second handle member is in juxtaposition with but does not frictionally engage a proximal end of said first handle member when said second handle member is mounted on the proximal part of said inner shaft member.

5. The tool of claim 4, wherein proximal to distal travel of said first and second handle members compresses said bias means and causes said first socket member to receive thereinto said second socket means, whereby engaging a test point inner part with said second socket means, advancing said first and second handle members in a proximal to distal direction until a test point outer part is engaged by said first socket means, followed by relative rotation of said first and second handle members effects removal of a test point.

6. The tool of claim 5, further comprising a third annular shoulder means formed at a proximal end of said bore means, said third annular shoulder means forming a stop means that limits insertion of said inner shaft member into said bore means.

7. A hand-held tool having utility in connection with the installation and removal of circuit board test points, comprising:

a first handle member;

an elongate shank member fixedly secured to said handle member;

a first socket means, adapted to engage an outer part of a test point, formed at a distal free end of said shank member;

a longitudinally extending central bore means formed in said first handle member, shank member and first socket member;

an elongate inner shaft member having a length greater than the combined length of said first handle member, shank member and first socket means;

a second socket means, adapted to engage a center part of a test point, formed at a distal free end of said inner shaft member;

said inner shaft member being slidably disposed in said central bore;

a proximal end of said inner shaft member protruding proximally of said first handle member;

a second handle member secured to said proximal end of said inner shaft member;

said second socket means protruding distally of said first socket means;

said inner shaft member having a proximal and a distal part disposed in longitudinally spaced, axially aligned relation to one another;

a bias means for maintaining said spaced relation between said proximal and distal parts when the tool is in an equilibrium condition;

said second socket means being retractable into said first socket means when said bias means is compressed;

said first and second socket means being independently rotatable with respect to one another when said first and second handle members are independently rotated, respectively;

a yoke member fixedly secured to the proximal part of said inner shaft member, said yoke member slideably receiving a proximal end of said distal part of said inner shaft member;

a slot means formed in said yoke member and a guide post member fixedly secured to said proximal end of said inner shaft member distal part, said guide post member being slideably disposed within said slot means;

a first annular shoulder formed at a distal end of said yoke member;

a second annular shoulder formed in said distal part of said inner shaft member;

said bias means being disposed between said first and second annular shoulders.

8. The tool of claim 7, further comprising a third annular shoulder means formed in a proximal end of said bore means to limit insertion of said inner shaft member into said bore means.

9. A hand-held tool having utility in connection with the installation and removal of circuit board test points, comprising:
   a first handle member;
   an elongated shank member fixedly secured to said handle member;
   a first socket means configured and dimensioned to engage a test point outer part being formed at a distal free end of said shank member;
   a bore means formed centrally of said first handle member, said shank member and said first socket means;
   an inner shaft member slidably disposed in said bore means;
   a second socket means configured and dimensioned to engage a test point inner part being formed at a distal free end of said inner shaft member;
   said first socket means having an inner diameter greater than an outer diameter of said second socket means so that said second socket means is retractable into said first socket means;
   said inner shaft member having a length greater than the combined length of said first handle member, said shank member and said first socket means so that a proximal end of said inner shaft member protrudes proximally of said first handle member and said second socket means extends distally of said first socket means;
   said inner shaft member being discontinuous in structure and including a proximal part and a distal part that are longitudinally spaced apart and axially aligned relative to one another;
   a yoke member fixedly secured to said proximal part, said yoke member slidably receiving a proximal end of the distal part of said inner shaft member;
   a first shoulder formed at a distal end of said yoke member;
   a second shoulder formed in said distal part of said inner shaft member;
   a bias means disposed between said first and second shoulders;
   a third shoulder member formed at a proximal end of said bore means to limit insertion of said inner shaft member into said bore means;
   a second handle member fixedly secured to the proximally protruding part of said inner shaft member;
   whereby a test point is removed by engaging its center part with said second socket means, compressing said bias means by advancing said first and second handle members in a proximal to distal direction until said second socket means is received into said first socket means and said first socket means engages the outer part of the test point, and rotating said first and second handle members relative to one another
   a proximal end of said yoke member abuttingly engaging said third annular shoulder means when said inner shaft member is slidably disposed within said bore means.

* * * * *